United States Patent [19]

Meyer et al.

[11] Patent Number: 4,861,680
[45] Date of Patent: Aug. 29, 1989

[54] BRONZE-GREY GLAZING FILM AND WINDOW MADE THEREFROM

[75] Inventors: Stephen F. Meyer, Los Altos; Claude A. Sans, Mountain View, both of Calif.

[73] Assignee: Southwall Technologies, Palo Alto, Calif.

[21] Appl. No.: 155,068

[22] Filed: Feb. 11, 1988

[51] Int. Cl.⁴ .......................... E06B 3/24; B32B 15/08
[52] U.S. Cl. .................................... 428/623; 428/630; 428/632; 428/674; 428/675; 428/677; 428/34
[58] Field of Search ............... 428/622, 623, 632, 660, 428/674, 675, 677, 630, 34

[56] References Cited

U.S. PATENT DOCUMENTS 4,546,050 10/1985 Amberger et al. .................. 428/623
4,716,086 12/1987 Gillery et al. ....................... 428/632

Primary Examiner—L. Dewayne Rutledge
Assistant Examiner—George Wyszomierski
Attorney, Agent, or Firm—Irell & Manella

[57] ABSTRACT

Bronze-grey films for window glazing structures are disclosed. The subject bronze-grey films are characterized by having a layer of reactive-sputtered titanium suboxide of controlled composition between the bronze-grey metal layer and the plastic sheet which makes up the substrate of the film. The process by which these films can be made is also disclosed. These films offer superior resistance to failure by delamination.

10 Claims, 1 Drawing Sheet

BRONZE-GREY GLAZING FILM AND WINDOW MADE THEREFROM

BACKGROUND OF THE INVENTION

1. Field of the Invention

This invention relates to bronze-grey colored transparent films which are employed in glazing products. More particularly, it relates to an improved composition of such films and to a method for their production using magnetron sputtering.

2. Description of the Prior Art

A wide range of metallized films are presently commercialized for use in glazing products. These films, which can have a plastic backing, carry one or more layers of metal. The metal layers are substantially transparent but do reflect a portion of the light and/or heat falling upon them. Thus, they are used in applications such as exterior window glazings where it is desirable to hold heat in a building, hold heat out of a building, or cut down the amount of sunlight entering a building. They also can be used for their esthetic effects where they present a metallic sheen to the glazing. This sheen can be a silver chrome-like color or can be tinted grey, bronze, gold, copper, or the like.

These films can be suspended or stretched between multiple glazing panes, as shown in U.S. Pat. No. 4,335,166 issued 15 June 1982 to Lizardo, et al, or it can be directly adhered to a glass glazing material either using a glue or merely surface tension.

Representative patents relating to the general area of metallized films for glazing products include the following: U.S. Pat. No. 4,298,444, issued 3 Nov. 1981; U.S. Pat. No. 4,307,942 issued 29 Dec. 1981 to Chahrourdi; U.S. Pat. No. 4,389,452 issued 21 June 1983 to Chahrourdi, et al; U.S. Pat. No. 4,322,276 issued 30 Mar. 1982 to Meckel, et al; Japanese Patent No. 8,571,251 dated 23 Apr. 1985 of Hitachi Chemical Co. Ltd.; U.S. Pat. No. 4,497,700 issued 5 Feb. 1985 to Groth, et al; U.S. Pat. No. 4,462,883 issued 31 July 1984 to Hart; U.S. Pat. No. 4,510,190 issued 9 Apr. 1985 to Glaser; U.S. No. 4,337,990 issued 6 July 1982 to Fon, et al; U.S. Pat. No. 4,534,841 issued 13 Aug. 1985 to Anton, et al; and U.S. Pat. No. 4,022,942 issued 10 May 1977 to Grubb, et al.

Since 1985, Southwall Technologies has manufactured and sold a metallized film having an attractive bronze-grey color and a transmission over the visible spectrum of about 25 to 30%. This material has a plastic backing and employs layers of copper and a "greying" metal to impart the desired transmissivity and bronze-grey color. It is documented in the literature that copper can adversely interact with plastic substrates. This results in low adhesion of copper layers. To address this problem, our prior materials contained a primer layer of titanium. This material was laid down ostensibly as titanium metal in a sputtering process without addition of reactive gas.

While this prior product and its method of manufacture were often very acceptable, at times the product failed. These failed products have been examined and it has been observed that the failures often had the characteristics or symptoms of an improper or inadequate primer coat.

It is an object of the present invention to provide an improved bronze-grey film which is more consistent and less susceptible to failures.

STATEMENT OF THE INVENTION

It has now been found that an improved bronze-grey film can be produced by the process of (a) depositing on a plastic substrate a transmissive 25–100 angstrom layer of titanium suboxide by reactively sputtering titanium in the presence of added oxygen, this added oxygen being from about 40 to about 97.5% of the stoichiometric amount corresponding to the sputtered titanium;

(b) depositing on the layer of titanium by magnetron sputtering a transmissive layer of copper metal; and (c) depositing on the layer of copper metal by magnetron sputtering a transmissive layer of a greying metal.

In a preferred embodiment, an additional layer of titanium suboxide similar to the first layer is laid down on top of the greying metal layer.

In another aspect this invention relates to the product of this process, and to the general class of bronze-grey films made up of a plastic film, a transmissive 25–100 angstrom layer of titanium suboxide, a layer of metallic copper, a layer of greying metal, and optionally an overlayer of titanium suboxide.

DETAILED DESCRIPTION OF THE INVENTION

DESCRIPTION OF PREFERRED EMBODIMENTS

As used in this specification and the appended claims, the following terms have defined meanings:

"Visible radiation" or "light" means electromagnetic radiation having a wavelength of from 380 nanometers to 750 nanometers. (CIE Standard)

"Transparent" or "transmissive" means having the property of transmitting visible radiation.

"Tvis" or "Tv" or "transmittance visible" each refer to a measure of transmittance over the visible spectrum. It is an integrated term covering the area under the transmittance versus wavelength curve throughout the visible wavelengths. (1931 CIE Illuminant C Standard)

"Transparent metal layer" or "transmissive metal layer" is a coherent metallic layer of a thickness which permits substantial transparency.

"Sputter deposit" or "Sputter deposited" refers to the process or the product of the process in which a layer of material is laid down by use of a magnetron sputterer. This is a known commercial process which is described in references such as S. Schiller, U. Heisig and K. Goedicke, *Thin Solid Films*, 54 (1978) 33; R. K. Waits, in J. L. Vossen and W. Kern (eds.), *Thin Film Processes*, Academic Press, New York, 1978, p. 131; J. A. Thornton and A. S. Penfold, in J. L. Vossen and W. Kern (eds.), *Thin Film Processes*, Academic Press, New York, 1978; and D. B. Fraser, in J. L. Vossen and W. Kern (eds.), *Thin Film Processes*, Academic Press, New York, 1978, which are incorporated herein by reference.

"Greying metals" refers to metals such as nickel, chromium, molybdenum, tungsten, and alloys such as monel, inconel, stainless steel-type 304 or 316, and the like which when laid down as transparent metal layer absorb light substantially uniformly over a relatively broad range of wavelengths so as to give a grey transmittance.

"Titanium suboxide" refers to an oxide of titanium, $TiO_x$, where x has a value of less than 2. $TiO_2$ is the stoichiometric compound. Preferred titanium suboxides have values for x ranging between about 0.8 and 1.95, with materials having values for x between about 1 and about 1.9 being more preferred and values of about 1.75 to 1.85 being most preferred.

"Reactive sputter deposit" or "reactive sputtering" refers to a sputter deposit process in which a reactive gas (in the present case an oxygen-containing gas) is intentionally added to the plasma zone of a magnetron sputterer during the deposition process.

Figures 1, 2:
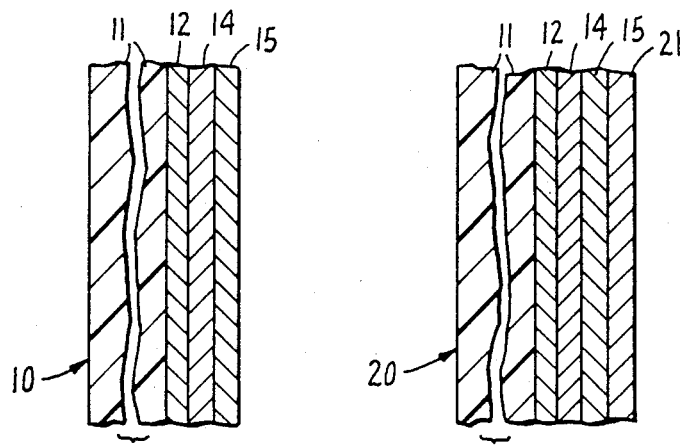
FIG. 1 is a schematic cross-sectional view of a typical film of this invention.
FIG. 2 is a schematic cross-sectional view of one form in which this film may be sold.

Turning now to FIG. 1, the bronze-grey film of this invention is depicted as 10. This film includes a transparent support 11. This support is shown in section because it is many times as thick as the metal layers adhered to it. A support of this type is required for practical application of the present invention. The metal layers themselves are at most only a few hundred nanometers thick and thus can have only minimal physical strength. Support 11 is a non-rigid but minimally stretchable transparent solid which can withstand the conditions of sputter deposition. Poly(ester)s including poly(ethylene terphthalate) and other terphthalate ester polymers, poly(urethanes), cellulose, ester polymers, acrylic polymers, and poly(vinyl fluoride)s from about 0.5 to about 10 mils in thickness are representative examples of non-rigid minimally stretchable films which may be employed. Poly(ester)s and, in particular, poly(ethylene terphthalate)s such as the du Pont "Mylars" that have a thickness from about 0.5 to about 2 mils and especially about 1 mils, are a preferred group of supports. Bronze-grey film 10 also contains a layer of titanium suboxide 12. This layer is from about 25 to about 100 angstroms in thickness. This thickness can also be defined indirectly by the transparency of the support with this layer upon it. (Thicker layers give lower transmittance, thinner layers a greater transmittance.) By this measurement the thickness of the titanium suboxide layer should give rise to a transmittance from about 50% to about 85% at 500 nanometers. This layer 12 is deposited by a reactive sputtering method using a titanium cathode and added oxygen source such as oxygen gas. The oxygen gas is suitably diluted with argon or another inert gas. While the actual deposit conditions employed will take into account the size and condition of the titanium cathode, the distance to the substrate, the voltages employed and the like, as is known in the art, commonly a partial pressure of $O_2$ of from about 0.1 microns to about 2 microns is employed together with from about 1 microns to about 4 microns of partial pressure of argon. The quantity of oxygen added in this step should be controlled to achieve the titanium suboxide stiochiometrics called for in this invention.

In production, the plastic substrate is generally subjected to a preglow or glow discharge pretreatment to enhance the titanium suboxide's adherence. This is carried out by subjecting the substrate to a glow discharge in the presence of from about 2 to about 20 and preferably 4 to about 12 microns pressure of oxygen and from about 0 microns to about 20 microns partial pressure of an inert gas such as argon.

Layer 14 is a layer of copper metal. This layer is put down by sputter deposition techniques and is about 100 to 400 angstroms in thickness. Such layers can also be characterized as having cumulative transparencies (that is together with the substrate and titanium suboxide underlayer) of from about 30 to 50% at 600 nm wavelength. Film 10 also includes a greying metal layer 15. This layer is from about 50 to 200 angstroms in thickness and is deposited by magnetron sputtering as well. The cumulative transmittance of a film in accord with FIG. 1 is from about 15 to 30% at 450 nanometers and about 20 to 30% at 600 nanometers.

By varying the amount of copper and the amount of greying metal, one can adjust the color of the resulting film. For example, increasing the amount of greying metal and reducing the amount of copper will raise transmittance in the longer wavelengths while the reverse will favor the shorter wavelengths.

While the material such as film 10 shown in FIG. 1 is useful in many applications, it can offer the disadvantage that the metallic films 14 and 15 are relatively fragile and can be damaged in use. Film 20 shown in FIG. 2 obviates this problem. Film 20 includes plastic substrate 11, titanium suboxide film 12, copper film 14, greying metal film 15, as described with reference to FIG. 1. It also includes a top layer of titanium suboxide 21. This layer is deposited by a reactive sputtering process and is generally similar in thickness, chemical composition, and transmission to layer 12.

The films of this invention can also contain additional overlayers to give them further strength and abrasion resistance. These overlayers can be additional layers of plastic glued to the titanium suboxide overlayer. They can also be hardcoat layers applied to the titanium suboxide layer. Such structures are known in the art and are to be applied in art-taught manners.

The films of this invention are used in glazing products. In one application, the films can be stretched between two sheets of glass or glazing material. Glazing structures of this type are illustrated in U.S. Pat. No. 4,335,166.

Figure 3:
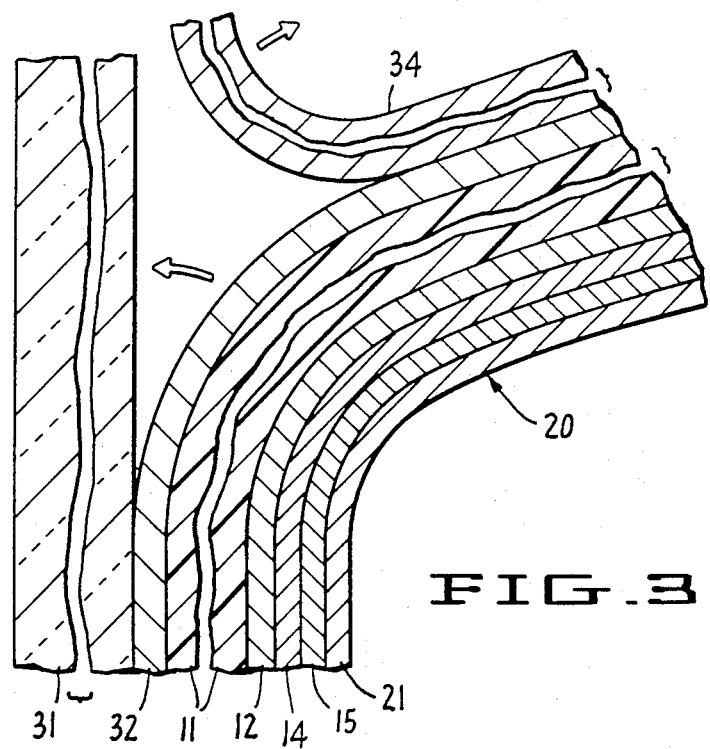
FIG. 3 is a schematic cross-sectional view of one application of this film in use.

More commonly, however, the films of this invention are applied directly to a glass surface. This can be carried out using adhesives. FIG. 3 illustrates such an application. FIG. 3 includes a glass pane 31 to which a film 20 of this invention is shown being applied. The film includes substrate 11, titanium suboxides layers 12 and 21, and copper and greying metal layers 14 and 15. The film additionally includes an adhesive layer 32 which is protected by strippable backing 34. As shown in the figure, the strippable backing is being removed upwards and the adhesive film is being applied onto the surface of glass pane 31.

DESCRIPTION OF BEST MODE

A bronze-grey film in accord with this invention is prepared on a commercial scale DC magnetron sputter drum coater. The substrate employed is 0.90-95 mil thick poly(ethylene terphthalate) roll stock. It is coated over a 0° C. drum using a five cathode set up. The first cathode is a high voltage oxygen preglow. The remaining four cathodes are run with 2-3 microns of added argon partial pressure. Cathodes 2 and 5 are titanium cathodes and are each operated with a 55 to 65% transmission value being achieved without added oxygen and a 75-85% transmission with added oxygen. The amount of added oxygen in the case of each of the titanium cathodes is controlled closely to achieve the desired suboxide structure. Generally, the suboxide is about 90% of stoichiometric, i.e., to give $TiO_x$ where $x=1.8$. Monel greying metal is laid down from cathode 4 to achieve a transmission at 450 nm of about 40–45% and copper is laid down from cathode 3 to a cumulative transmission of about 25–28% at 600 nm.

The material so produced has a consistent bronze-grey color and its metal layers are all adherent to the substrate without significant delamination or other failures.

It will be appreciated by those skilled in the art that while the present invention has been described with reference to particular materials and preferred conditions, the invention can also be practiced with equivalent conditions and materials and its scope is as defined by the following claims.

What is claimed is:

1. A bronze-grey film glazing component comprising
   a. a plastic film support;
   b. a 25 to 100 angstrom layer of titanium suboxide reactive sputter-deposited to a composition of $TiO_x$, wherein the value of x is between about 0.8 and about 1.95, said layer being adhered to the surface of the support;
   c. a transmissive layer of copper metal adhered to the titanium suboxide layer; and
   d. a transmissive layer of greying metal adhered to the layer of copper.

2. The bronze-grey film glazing component of claim 1 additionally comprising
   e. a 25 to 100 angstrom layer of titanium suboxide reactive sputter-deposited to a composition of $TiO_x$, wherein the value of x is between about 0.8 and about 1.95, said layer being adhered to the surface of the greying metal layer.

3. The bronze-grey film of claim 2 wherein the plastic film support is a poly(ester) film.

4. The bronze-grey film of claim 2 wherein the plastic film support is a poly (ethylene terphthalate) film.

5. The bronze-grey film of claim 4 additionally characterized by having a transmission value at 500 nm of from 50 to 85 percent for the poly(ethylene terphthalate) plus two layers of titanium suboxide.

6. The bronze-grey film of claim 5 wherein the poly(ethylene terphthalate) is a glow discharge-treated poly(ethylene terphthalate).

7. The bronze-grey film of claim 6 wherein x in layers b and e has a value of from about 1 to about 1.9.

8. The bronze-grey film of claim 7 where x in layers b and e has a value of about 1.8.

9. A window glazing structure comprising a glass pane having a bronze-grey film of claim 7 adhered to one of its surfaces.

10. A multi-pane glazing structure comprising two parallel glass panes spaced apart from one another and defining an air space between them and a bronze-grey film of claim 7 suspended in said air space parallel to the glass panes.

* * * * *